(12) United States Patent
Cheng et al.

(10) Patent No.: US 10,083,871 B2
(45) Date of Patent: Sep. 25, 2018

(54) FABRICATION OF A VERTICAL TRANSISTOR WITH SELF-ALIGNED BOTTOM SOURCE/DRAIN

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/177,358

(22) Filed: Jun. 9, 2016

(65) Prior Publication Data

US 2017/0358497 A1    Dec. 14, 2017

(51) Int. Cl.
| | |
|---|---|
| *H01L 21/8234* | (2006.01) |
| *H01L 27/088* | (2006.01) |
| *H01L 21/02* | (2006.01) |
| *H01L 23/528* | (2006.01) |
| *H01L 23/532* | (2006.01) |
| *H01L 29/06* | (2006.01) |

(52) U.S. Cl.
CPC ........ *H01L 21/823418* (2013.01); *H01L 21/02532* (2013.01); *H01L 21/823431* (2013.01); *H01L 21/823468* (2013.01); *H01L 21/823481* (2013.01); *H01L 21/823487* (2013.01); *H01L 23/528* (2013.01); *H01L 23/53209* (2013.01); *H01L 23/53228* (2013.01); *H01L 23/53257* (2013.01); *H01L 27/0886* (2013.01); *H01L 29/0649* (2013.01)

(58) Field of Classification Search
CPC ............ H01L 29/66795; H01L 29/785; H01L 29/7827; H01L 29/66666; H01L 27/0886; H01L 29/0847; H01L 21/823807; H01L 27/0924; H01L 21/31144; H01L 21/823487

See application file for complete search history.

(56) References Cited

U.S. PATENT DOCUMENTS

| | | |
|---|---|---|
| 6,677,205 B2 | 1/2004 | Beintner |
| 6,747,314 B2 | 6/2004 | Sundaresan et al. |
| 7,176,089 B2 | 2/2007 | Furukawa et al. |
| 7,592,218 B2 | 9/2009 | Brown |

(Continued)

FOREIGN PATENT DOCUMENTS

| | | |
|---|---|---|
| CN | 100570894 | 12/2009 |
| WO | 2005/079182 | 9/2005 |

*Primary Examiner* — Marc Armand
*Assistant Examiner* — Quinton Brasfield
(74) *Attorney, Agent, or Firm* — Tutunjian & Bitetto, P.C.; Vazken Alexanian

(57) ABSTRACT

A method of forming a vertical fin field effect transistor (vertical finFET) with a self-aligned bottom source/drain, including forming a doped layer on a substrate, forming one or more vertical fins on the doped layer, forming a protective layer on the one or more vertical fins, wherein the protective layer has a thickness, and forming at least one isolation trench by removing at least a portion of the protective layer on the doped layer, wherein the isolation trench is laterally offset from at least one of the one or more vertical fins by the thickness of the protective layer.

20 Claims, 11 Drawing Sheets

(56) References Cited

U.S. PATENT DOCUMENTS

| | | | |
|---|---|---|---|
| 7,683,428 B2* | 3/2010 | Chidambarrao | H01L 29/66787 257/302 |
| 8,637,849 B2 | 1/2014 | Deligianni et al. | |
| 2010/0015778 A1* | 1/2010 | Lin | H01L 21/76232 257/E21.54 |
| 2014/0175554 A1* | 6/2014 | Loubet | H01L 21/82341 257/368 |
| 2014/0312432 A1* | 10/2014 | Ching | H01L 29/66795 257/401 |
| 2015/0102386 A1* | 4/2015 | Chen | H01L 21/82341 257/192 |

* cited by examiner

FABRICATION OF A VERTICAL TRANSISTOR WITH SELF-ALIGNED BOTTOM SOURCE/DRAIN

BACKGROUND

Technical Field

The present invention generally relates to the fabrication of vertical fin field effect transistors (vertical finFETs) with self-aligned source/drains, and more particularly to the use of the thickness of a conformally deposited layer to control lateral positioning of bottom source/drains and isolation trenches.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present principles, a method is provided of forming a vertical fin field effect transistor (vertical finFET) with a self-aligned bottom source/drain. The method includes the step of forming a doped layer on a substrate, forming one or more vertical fins on the doped layer, forming a protective layer on the one or more vertical fins, wherein the protective layer has a thickness, and forming at least one isolation trench by removing at least a portion of the protective layer on the doped layer, wherein the isolation trench is laterally offset from at least one of the one or more vertical fins by the thickness of the protective layer.

The method further includes the step of forming a gate structure on at least one of the one or more vertical fins, and forming a contact gap through the gate structure to one of the two or more doped layer regions.

In accordance with an embodiment of the present principles, a method is provided of forming a vertical fin field effect transistor (vertical finFET) with a self-aligned bottom source/drain. The method includes the step of forming a doped layer on a substrate, forming a plurality of vertical fins on the doped layer, wherein there is a distance between at least two adjacent vertical fins forming an intervening space, forming a protective layer on the one or more vertical fins, wherein the protective layer has a thickness equal to or greater than half the distance between the at least two adjacent vertical fins, such that the protective layer fills the intervening space, and forming at least one isolation trench by removing at least a portion of the protective layer on the doped layer, wherein the protective layer filling the intervening space prevents formation of the at least one isolation trench in the intervening space.

In accordance with another embodiment of the present principles, a vertical fin field effect transistor (vertical finFET) having a self-aligned bottom source/drain is provided. The vertical finFET includes one or more doped layer regions on a substrate, one or more vertical fins formed on one of the one or more doped layer regions, wherein the one of the one or more doped layer regions forms a bottom source drain for the one or more vertical fins, one or more dielectric spacer(s) on the substrate, wherein at least one of the one or more dielectric spacer(s) is offset from at least one of the one or more vertical fins by a width, $W_1$, that defines a boundary along a side of one of the one or more doped layer regions, and a metal contact between the at least one of the one or more dielectric spacer(s) and the at least one of the one or more vertical fins, wherein the metal contact is on the one of the one or more doped layer regions and in electrical contact with the one of the one or more doped layer regions.

The vertical finFET further includes a gate structure on the one or more vertical fins formed on the one of the one or more doped layer regions, and a gap liner, wherein the gap liner is between the gate structure and the at least one of the one or more dielectric spacer(s) offset from the at least one of the one or more vertical fins, and the gap liner physically and electrically separates the metal contact from the gate structure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Principles and embodiments of the present disclosure relate generally to the fabrication of vertical fin field effect transistor (vertical finFET) devices with the vertical fins self-aligned with an underlying doped region. The lateral positioning of the vertical fins relative to the perimeter of a doped region in the substrate may be determined by the thickness of a masking layer formed on the vertical walls of the fins, where the layer thickness can define a lateral offset.

In various embodiments, the doped region forming a bottom source/drain for a finFET device with the same number of vertical fins has approximately the same dimensions because the thickness of a masking layer defines the lateral offset of the periphery of the doped region.

Principles and embodiments of the present disclosure also relates to the formation of isolation trenches in regions of the substrate between vertical fins that are not pinched off by a masking layer. In various embodiments, a portion of a doped region and underlying substrate may be removed to form an isolation trench between masked vertical fins, while other portions of the doped region remain unetched due to a greater vertical thickness of the masking layer between the top of the masking layer and the substrate.

Exemplary applications/uses to which the present principles can be applied include, but are not limited to: NAND gates, NOR gates, XOR gates, static random access memory (SRAM), inverters, etc.

It is to be understood that the present invention will be described in terms of a given illustrative architecture; however, other architectures, structures, substrate materials and process features and steps may be varied within the scope of the present invention.

Figure 1:
FIG. 1 is a cross-sectional view showing a substrate, in accordance with the present principles.

Referring now to the drawings in which like numerals represent the same or similar elements and initially to FIG. 1, is a cross-sectional view showing a substrate, in accordance with the present principles.

In one or more embodiments, a substrate 110 may be a semiconductor or an insulator with an active surface semiconductor layer. The substrate may be crystalline, semi-crystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, InP, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 110 may be a silicon wafer, a silicon germanium wafer, or III-V semiconductor wafer. In an embodiment, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In various embodiments, the surface of the wafer or active layer may be processed to form a thermal oxide and/or doped region. The surface may have a predetermined crystal orientation for epitaxial growth of subsequent layers.

Figure 2:
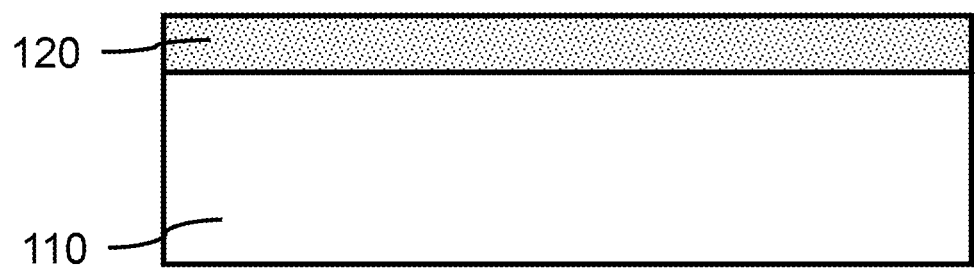
FIG. 2 is a cross-sectional view showing a doped layer on a substrate, in accordance with the present principles.

FIG. 2 is a cross-sectional view showing a doped layer on a substrate, in accordance with the present principles.

In one or more embodiments, a doped layer 120 may be formed on the substrate 110. The doped layer may be formed by epitaxial growth of a semiconductor layer on the substrate with in-situ doping to preserve the crystallinity and crystallographic orientation of the substrate. In various embodiments, an epitaxially grown doped layer may be doped with boron, where the doped layer may be SiGe to form a p-type FET. In various embodiments, an epitaxially grown doped layer may be doped with phosphorus, arsenic, indium, or combinations thereof, where the doped layer may be Si to form an n-type FET. In various embodiments, carbon may also be added to the doped layer.

In various embodiments, a doped layer 120 may be formed by ex-situ doping, for example, by ion implantation, plasma doping, gas phase doping, solid phase doping, or liquid phase doping, to the substrate 110 or an active layer on a substrate. In various embodiments, the doping concentration may be in the range of about $1\times10^{19}/cm^3$ to about $2\times10^{21}/cm^3$, although other doping concentrations are contemplated.

In various embodiments, the doped layer 120 may have a thickness in the range of about 10 nm to about 100 nm, or in the range of about 20 nm to about 50 nm, or in the range of about 30 nm to about 40 nm, although other thicknesses are contemplated.

Figure 3:
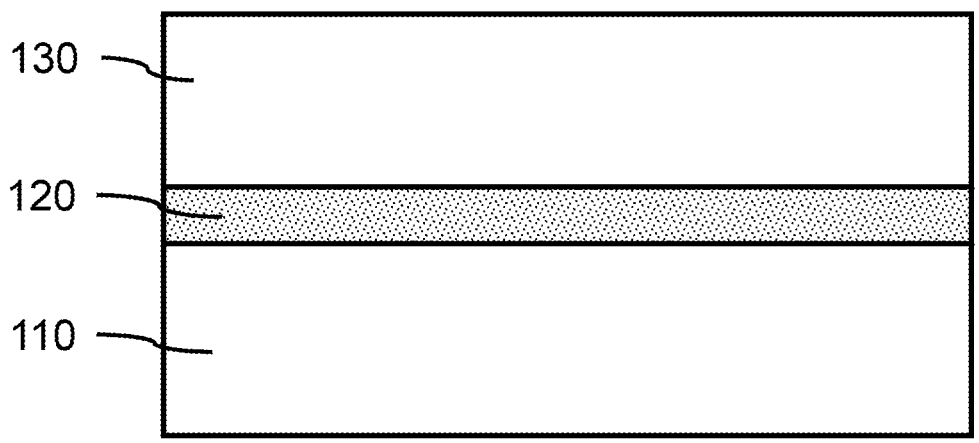
FIG. 3 is a cross-sectional view showing a channel layer formed on the doped layer, in accordance with the present principles.

FIG. 3 is a cross-sectional view showing a channel layer formed on the doped layer, in accordance with the present principles.

In one or more embodiments, a channel layer 130 may be formed on the doped layer 120, where the channel layer 130 may be a semiconductor layer. In various embodiments, a channel layer 130 may be formed on a crystalline doped layer 120 by epitaxial growth of an intrinsic semiconductor material. In various embodiments, the channel layer may be an intrinsic silicon or silicon-germanium (SiGe) material grown on a doped SiGe doped layer 120.

In various embodiments, the channel layer 130 may have a thickness in the range of about 20 nm to about 100 nm, or in the range of about 30 nm to about 80 nm, or in the range of about 40 nm to about 60 nm, although other thicknesses are contemplated. The channel layer thickness may determine the height of vertical fins subsequently formed on the doped layer 120.

Figure 4:
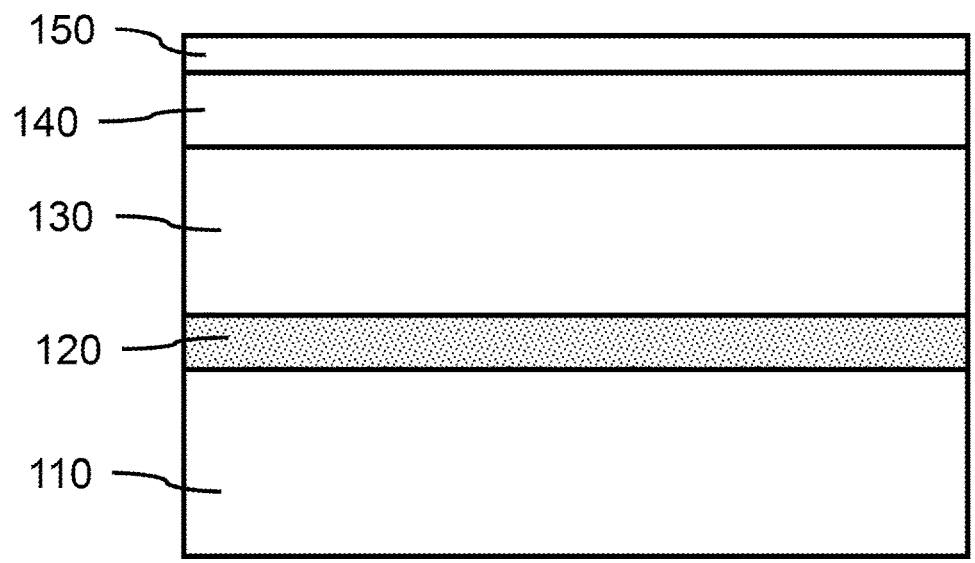
FIG. 4 is a cross-sectional view showing a hardmask layer and a photo mask layer formed on the channel layer, in accordance with the present principles.

FIG. 4 is a cross-sectional view showing a hardmask layer and a photo mask layer formed on the channel layer, in accordance with the present principles.

In one or more embodiments, a hardmask layer 140 may be formed on an exposed surface of the channel layer 130. A photo mask layer 150 may be formed on the exposed surface of the hardmask layer 140. In various embodiments, the hardmask layer may be an oxide, for example, silicon oxide (SiO), a nitride, for example, a silicon nitride (SiN), or an oxynitride, for example, silicon oxynitride (SiON), or combinations thereof. In various embodiments, the hardmask layer 140 may be silicon nitride (SiN), for example, $Si_3N_4$. The hard mask 140 layer may be formed by a thermal process, such as, for example, oxidation or nitridation of the semiconductor channel layer 130. A combination of the various deposition and/or growth processes may also be used to form hardmask layer 140.

In various embodiments, a photo mask layer 150 may be a temporary resist (e.g., polymethyl methacrylate (PMMA)) that may be deposited on the hardmask layer 140, patterned, and developed to expose portions of the hardmask layer 140. The photo mask layer 150 may be a positive resist or a negative resist.

In various embodiments, the hardmask layer 140 may have a thickness in the range of about 20 nm to about 80 nm, or in the range of about 30 nm to about 60 nm, or in the range of about 40 nm to about 50 nm, although other thicknesses are contemplated.

Figure 5:
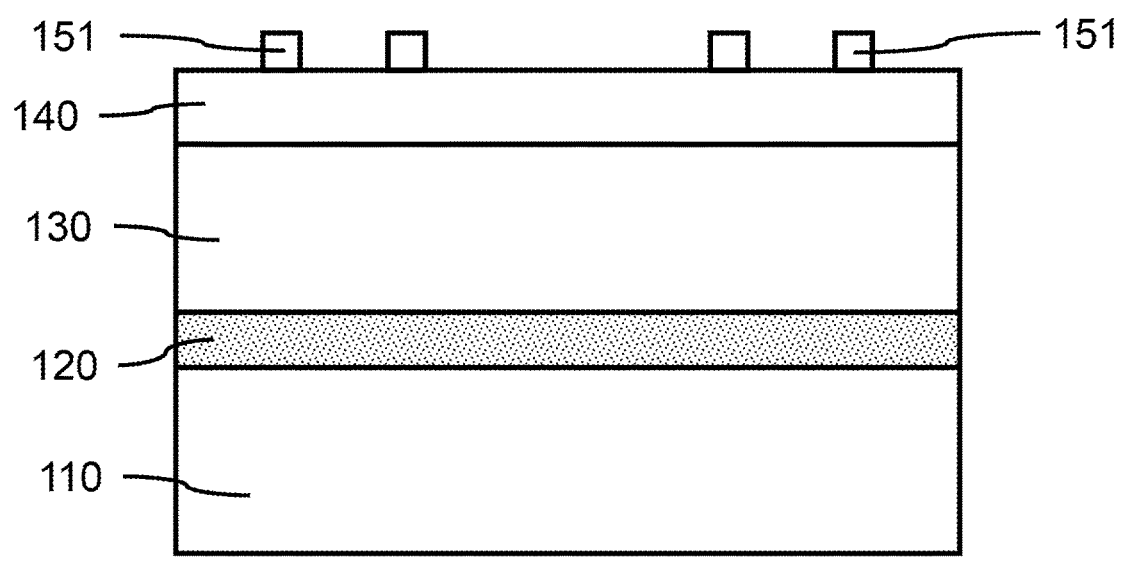
FIG. 5 is a cross-sectional view showing a photo mask layer patterned on the hardmask layer, in accordance with the present principles.

FIG. 5 is a cross-sectional view showing a photo mask layer patterned on the hardmask layer, in accordance with the present principles.

In one or more embodiments, the photo mask layer 150 may be patterned and developed to form photo mask blocks 151 covering at least a portion of the surface of the hardmask layer 140. Portions of the photo mask layer 150 may be removed to form the photo mask blocks 151 and expose underlying portions of the hardmask layer 140. The photo mask blocks 151 may protect the covered portion of the hardmask layer 140, while exposed portions of the hardmask layer 140 may be etched to form hardmask fin templates on the channel layer 130. One or more photo mask blocks 151 may define the width, length, and pitch of the one or more hardmask fin templates and thereby, the width, length, and pitch of the one or more vertical fins formed in the channel layer 130.

In one or more embodiments, the photo mask blocks 151 may have a width in the range of about 6 nm to about 20 nm, or may have a width in the range of about 8 nm to about 15 nm, or may have a width in the range of about 10 nm to about 12 nm. The photo mask blocks 151 may have a length in the range of about 100 nm to about 1000 nm, or in the range of about 100 nm to about 500 nm, or in the range of about 100 nm to about 400 nm, or in the range of about 100 nm to about 200 nm.

In various embodiments, there may be a pitch between adjacent photo mask blocks 151 in the range of about 15 nm to about 200 nm, or in the range of about 30 nm to about 100 nm, or in the range of about 30 nm to about 50 nm, or about 42 nm.

Figure 6:
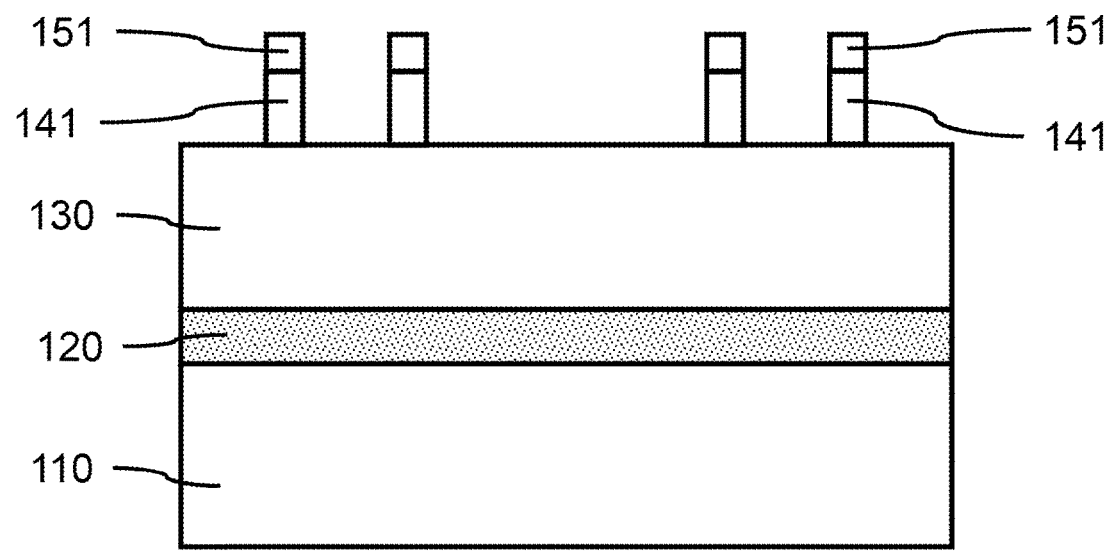
FIG. 6 is a cross-sectional view showing the photomask blocks on a plurality of hardmask fin templates on a channel layer, in accordance with the present principles.

FIG. 6 is a cross-sectional view showing the photomask blocks on a plurality of hardmask fin templates on a channel layer, in accordance with the present principles.

In one or more embodiments, the hardmask layer 140 may be etched to form one or more hardmask fin template(s) 141, where the photo mask blocks 151 defined the width, length, and location of the hardmask fin template(s) 141 on the channel layer 130. In various embodiments, the hardmask fin template(s) 141 may be formed by a dry plasma etch.

In one or more embodiments, the photo mask blocks 151 may be removed to expose the top surface(s) of the one or more hardmask fin template(s) 141. The photo mask blocks 151 may be removed by known stripping methods.

Figure 7:
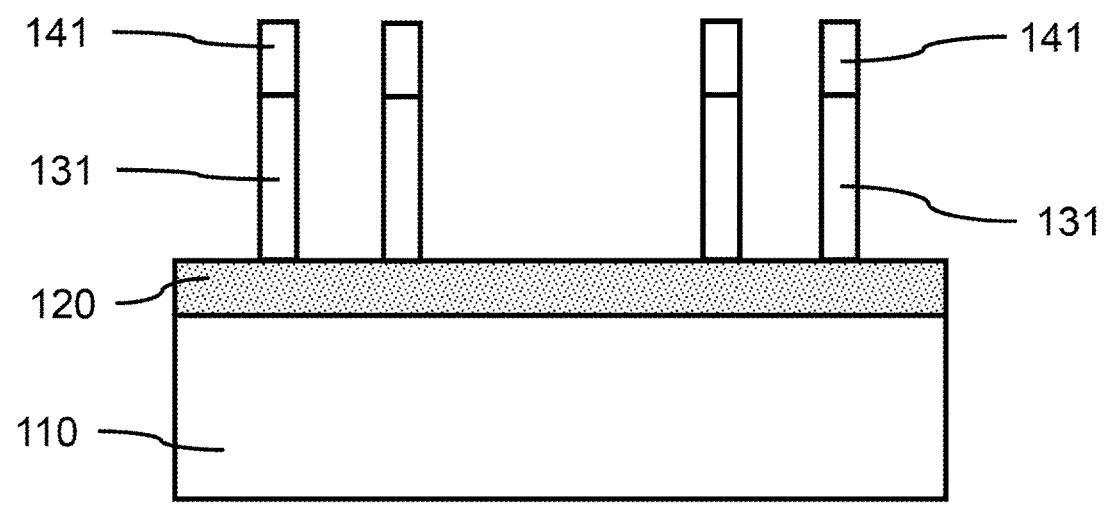
FIG. 7 is a cross-sectional view showing a plurality of hardmask fin templates and vertical fins on a doped layer, in accordance with the present principles.

FIG. 7 is a cross-sectional view showing a plurality of hardmask fin templates and vertical fins on a doped layer, in accordance with the present principles.

In one or more embodiments, the pattern of the hardmask fin template(s) 141 may be transferred to the channel layer 130. Portions of the channel layer 130 between hardmask fin template(s) 141 may be removed to form a plurality of vertical fins 131 on the doped layer 120. In various embodiments, one or more vertical fin(s) 131 may be formed by an anisotropic etch that removes channel layer material not covered by a hardmask fin template 141, where the vertical fin(s) 131 may have approximately vertical sidewalls and endwalls. The channel layer material may be removed down to the interface of the channel layer 130 with the doped layer 120, where the doped layer may be exposed between adjacent hardmask fin template(s) 141 and vertical fins 131. In various embodiments, an anisotropic etch may be a dry plasma etch, for example, a reactive ion etch (RIE).

In one or more embodiments, the vertical fin(s) 131 may have a width in the range of about 4 nm to about 20 nm, or may have a width in the range of about 6 nm to about 15 nm, or may have a width in the range of about 8 nm to about 12 nm.

In various embodiments, a sidewall image transfer (SIT) technique may be used to form one or more vertical fins 131 on the doped layer 120. In a typical SIT process, spacers are formed on the sidewall of a sacrificial mandrel. The sacrificial mandrel is removed and the remaining upright spacers are used as hardmask fin template(s) 141 to etch the top semiconductor layer and form one or more vertical fins 131.

The upright spacers are then removed after the semiconductor vertical fins 131 have been formed.

Figure 8:
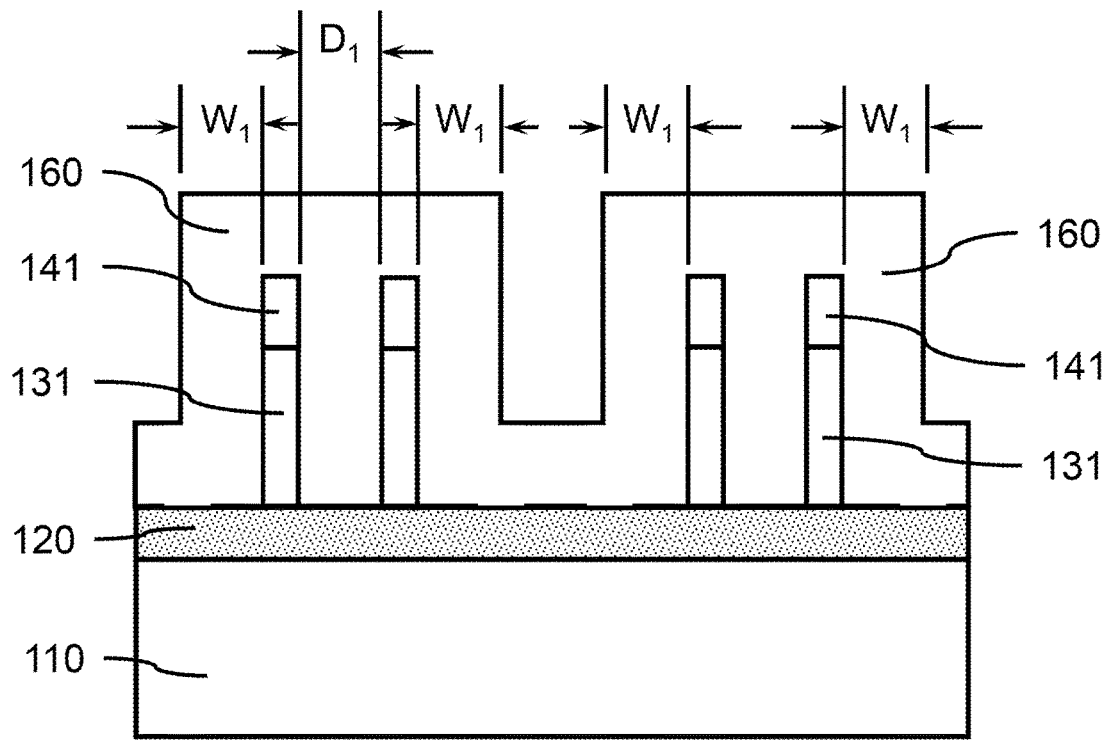
FIG. 8 is a cross-sectional view showing a protective layer on a plurality of hardmask fin templates and vertical fins, in accordance with the present principles.

FIG. 8 is a cross-sectional view showing a protective layer on a plurality of hardmask fin templates and vertical fins, in accordance with the present principles.

In one or more embodiments, a protective layer 160 may be formed on the one or more hardmask fin template(s) 141 and one or more vertical fins 131 to protect the vertical fins 131 during subsequent etching processes. The protective layer 160 may cover the hardmask fin templates 141 and vertical fins 131, and fill in spaces between particular vertical fins 131 having a predetermined pitch. In various embodiments, the predetermined pitch may be about twice the intended thickness of the protective layer 160 formed on the vertical fin sidewalls.

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

In one or more embodiments, the protective layer 160 may be conformally formed on at least the sidewalls of the vertical fin(s) 131, for example, by ALD, where the thickness of the protective layer may be controlled within a tolerance of the thickness of approximately one monolayer. In various embodiments, the protective layer 160 may be conformally formed on at least the sidewalls of the vertical fin(s) 131 by CVD or a combination of CVD and ALD.

In one or more embodiments, the protective layer 160 may have a thickness, $W_1$, in the range of about 5 nm to about 50 nm, or in the range of about 10 nm to about 30 nm, or in the range of about 15 nm to about 25 nm. The thickness of the protective layer 160 on the sidewall(s) and/or endwall(s) of the vertical fin(s) 131 may form an offset equal to the thickness, $W_1$, where the offset may determine the distance of an unmasked region from a vertical fin 131 for subsequent processing.

In one or more embodiments, the thickness, $W_1$, of the protective layer 160 conformally formed on the vertical fins may be approximately half the distance, $D_1$, between the facing sidewalls of two adjacent vertical fins ($D_1 \leq 2 \times W_1$), where two or more vertical fins may have a pitch predetermined to locate the vertical fins 131 on the same bottom source/drain. In various embodiments, the distance, $D_1$, between the sidewalls of the vertical fin(s) 131 may be in the range of about 10 nm to about 100 nm, or in the range of about 10 nm to about 60 nm, or in the range of about 20 nm to about 50 nm, or in the range of about 30 nm to about 50 nm. In various embodiments, the distance, $D_1$, between the sidewalls of the vertical fin(s) 131 the thickness, $W_1$, of the protective layer 160 conformally formed on the vertical fins may be such that the space between adjacent vertical fins 131 is filled with the protective layer 160, such that the doped layer 120 is pinched off between the particular vertical fins 131. In various embodiments, the thickness, $W_1$, of the protective layer 160 may be greater than ½ of the distance, $D_1$, ($W_1 > ½ D_1$), so a lateral offset of an isolation region may be independent of the distance, $D_1$, between the sidewalls of the vertical fin(s) 131 and the fin pitch.

In one or more embodiments, a distance, $D_2$, may be between the facing sidewalls of two adjacent vertical fins 131, where $D_2 > (2 \times W_1)$, where two or more vertical fins may have a pitch predetermined to locate the vertical fins 131 on different doped layer regions 121 after formation of an isolation trench 170. In various embodiments, $D_2$ may be approximately twice the thickness, $W_1$, of the conformal protective layer 160 plus the width, $D_3$, of an isolation trench positioned between the two adjacent vertical fins 131, ($D_2 = (2 \times W_1) + D_3$).

In various embodiments, one or more intervening vertical fin(s) 131 may be removed, for example, by a fin-cut process, to increase the distance between adjacent vertical fins 131, so a distance, $D_2$, is greater than $2 \times D_1$. An intervening vertical fin 131 may be removed to create a greater distance between two adjacent vertical fins 131 for forming an isolation trench in the location of the removed vertical fin 131.

Figure 9:
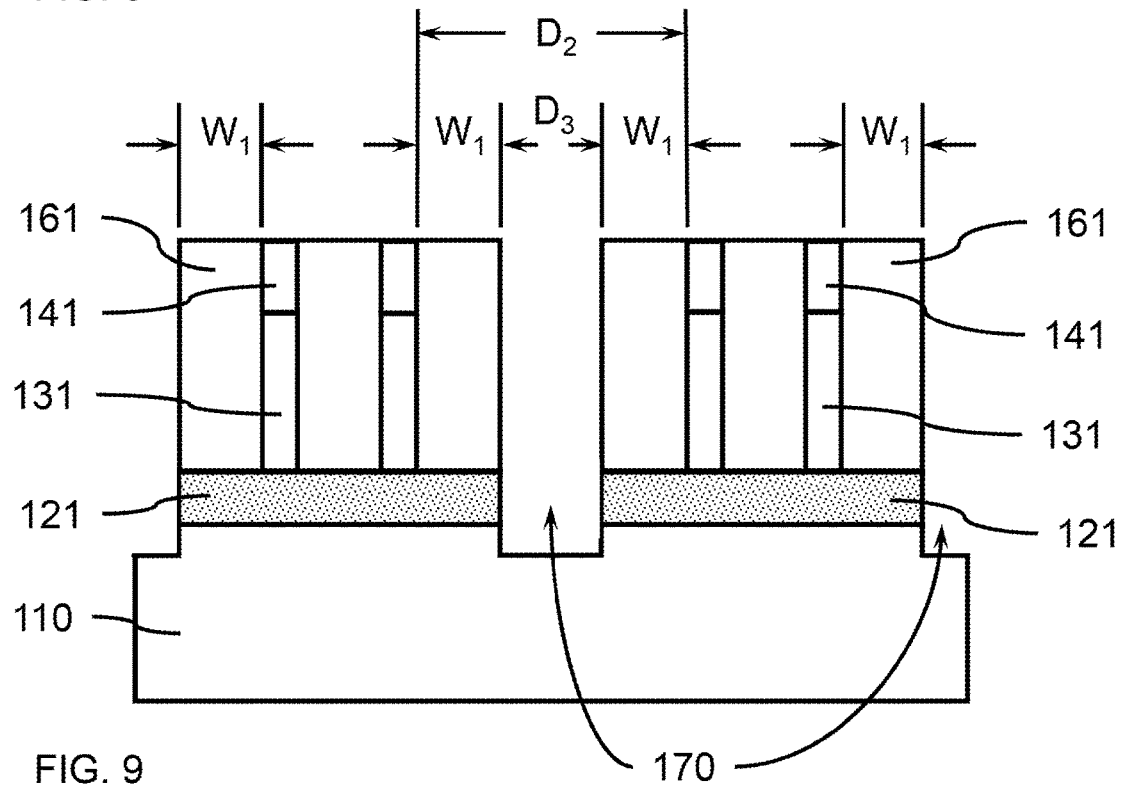
FIG. 9 is a cross-sectional view showing an isolation trench between two adjacent vertical fins covered by a protective layer, in accordance with the present principles.

FIG. 9 is a cross-sectional view showing an isolation trench between two adjacent vertical fins covered by a protective layer, in accordance with the present principles.

In one or more embodiments, an isolation trench 170 may be formed between two adjacent vertical fins 131 having a pitch greater than the pitch of two adjacent vertical fins 131 forming a multi-fin vertical finFET. In various embodiments, the isolation trench 170 may be self-aligned with vertical fins 131 by the conformally deposited protective layer 160, where the thickness of the protective layer 160 determines the position of the isolation trench 170 relative to the adjacent vertical fins.

In one or more embodiments, an isolation trench 170 may be formed by a reactive ion etch (RIE), where a portion of the protective layer 160 on the surface of the doped layer 120 is removed, such that the doped layer 120 forms two doped layer regions 121 separated by the isolation trench 170. The isolation trench 170 may extend into the substrate to electrically separate the doped layer 120 into two doped layer regions 121 that may act as bottom source/drains for a vertical finFET. In various embodiments, one or more isolation trenches may be formed through a doped layer to form two or more doped layer regions.

In various embodiments, adjacent doped layer regions 121 may be separated by the distance, $D_3$, in the range of about 10 nm to about 200 nm, or in the range of about 25 nm to about 100 nm, or in the range of about 40 nm to about 60 nm, where the widths for the isolation trenches may be in the range of about 10 nm to about 200 nm, or in the range of about 25 nm to about 100 nm, or in the range of about 40 nm to about 60 nm. Other widths for the isolation trenches are also contemplated. The widths of the isolation trenches 170 may be the same or different.

Figure 10:
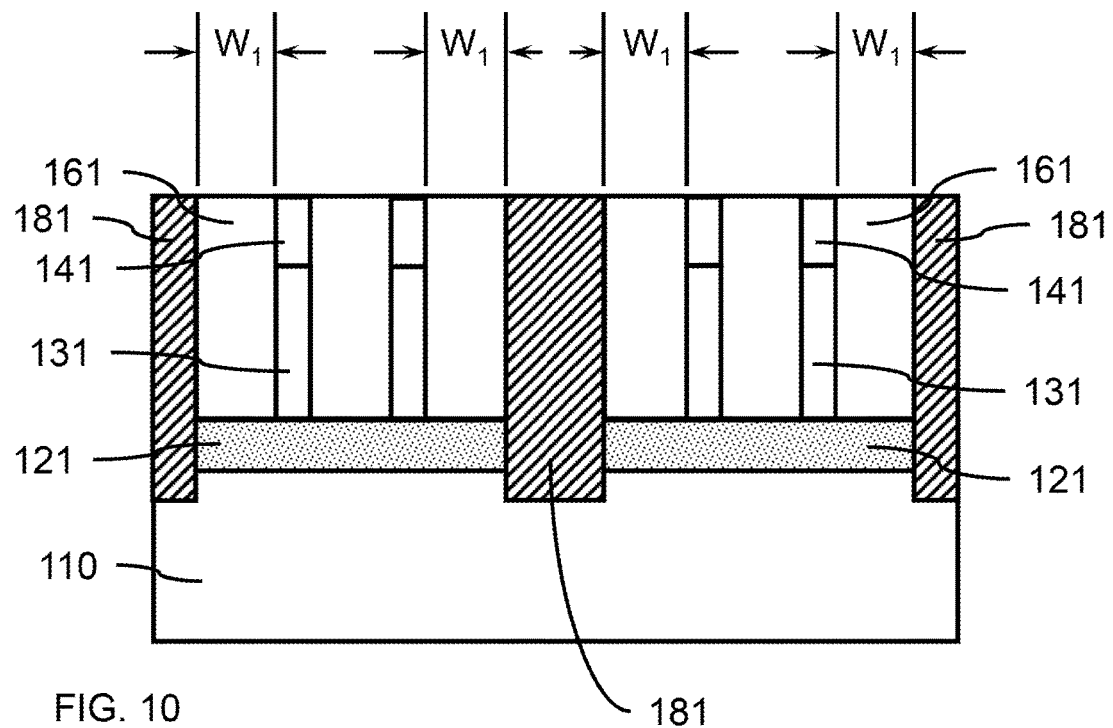
FIG. 10 is a cross-sectional view showing isolation trenches filled with a dielectric spacer forming two doped layer regions, in accordance with the present principles.

FIG. 10 is a cross-sectional view showing isolation trenches filled with a dielectric spacer forming two doped layer regions, in accordance with the present principles.

In one or more embodiments, a dielectric spacer 181 may be formed in one or more isolation trenches 170. The dielectric spacer 181 may be formed by a blanket deposition that fills in the isolation trenches 170. The dielectric spacer 181 may be separated from vertical fin(s) 131 by the width, $W_1$, of protective layer blocks 161. In various embodiments, the dielectric spacer 181 may extend above the top surface(s) of the protective layer blocks 161 and/or hardmask fin template(s) 141. The excess dielectric spacer material above the top surface(s) may be removed by a planarization process, for example, chemical-mechanical polishing (CMP) after the deposition.

In one or more embodiments, the dielectric spacer 181 may be a nitride, for example, silicon nitride (SiN), or an oxynitride, for example, silicon oxynitride (SiON).

Figure 11:
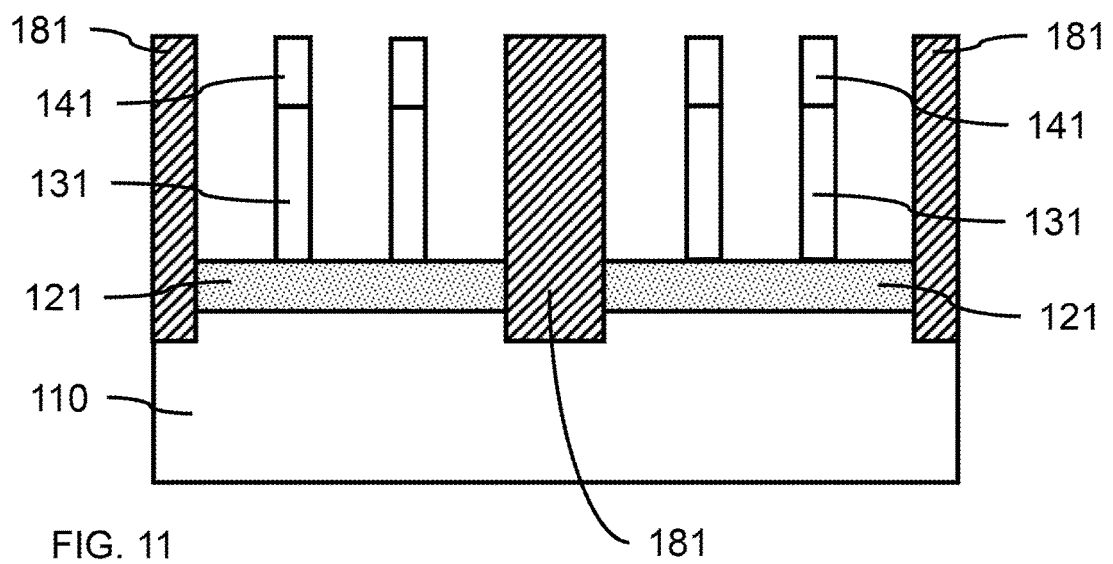
FIG. 11 is a cross-sectional view showing dielectric spacers and vertical fins after removal of the protective layer blocks, in accordance with the present principles.

FIG. 11 is a cross-sectional view showing dielectric spacers and vertical fins after removal of the protective layer blocks, in accordance with the present principles.

In one or more embodiments, protective layer blocks 161 may be removed from between the vertical fins 131 and hardmask fin template(s) 141, where the protective layer blocks 161 may be removed by a selective dry or wet etch. Removal of the protective layer blocks 161 exposes portions of the doped layer regions 121 below the vertical fin(s) 131.

Figure 12:
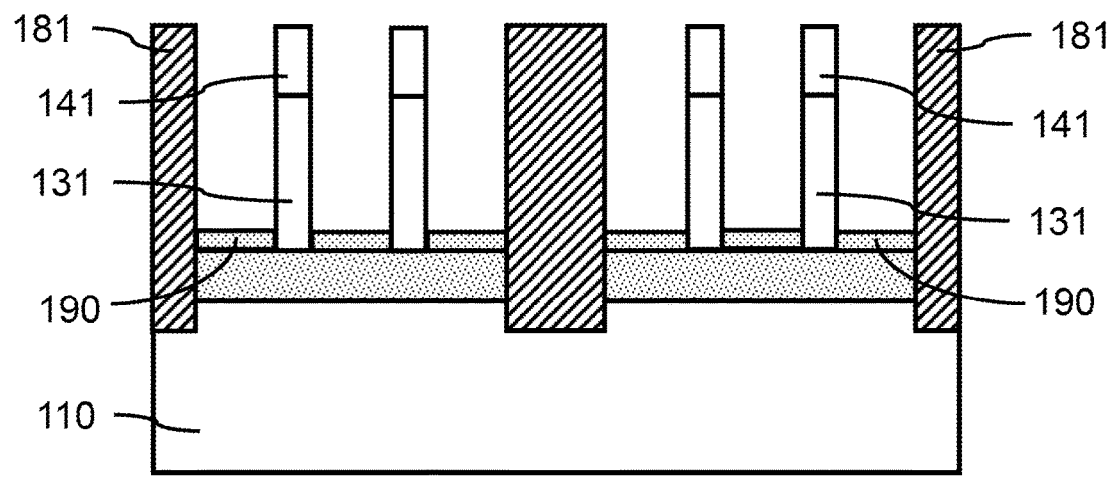
FIG. 12 is a cross-sectional view showing bottom spacers formed on the doped layer segments between the vertical fins after removal of the protective layer blocks, in accordance with the present principles.

FIG. 12 is a cross-sectional view showing bottom spacers formed on the doped layer segments between the vertical fins after removal of the protective layer blocks, in accordance with the present principles.

In one or more embodiments, a bottom spacer 190 may be formed on the doped layer segments, where the bottom spacer 190 may be formed by an anisotropic deposition. In various embodiments, the bottom spacer 190 may be formed by a directional deposition such as a high density plasma (HDP) deposition, which deposits more material on the horizontal surfaces than on the vertical sidewalls. An etchback process may be performed to remove any spacer material formed on the sidewalls of the vertical fins 131. The spacer material remaining on the surface of the doped layer regions 121 between the vertical fin(s) 131 becomes the bottom spacer 190. In various embodiments, the bottom spacer 190 can be formed by filling the trenches with a dielectric material and then removing a portion of the bottom spacer material, and leaving a portion of the dielectric material as the bottom spacer 190.

In various embodiments, the bottom spacer 190 may be a silicon oxide, silicon nitride, silicon oxynitride, SiOCN, SiBCN, etc.

Figure 13:
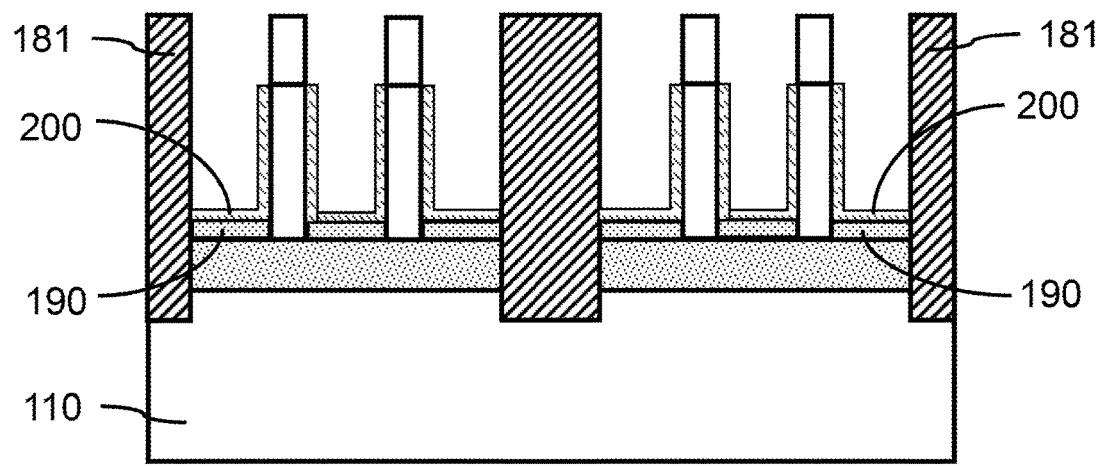
FIG. 13 is a cross-sectional view showing a gate dielectric layer formed on the bottom spacers and sidewalls of the vertical fins, in accordance with the present principles.

FIG. 13 is a cross-sectional view showing a gate dielectric layer formed on the bottom spacers and sidewalls of the vertical fins, in accordance with the present principles.

In one or more embodiments, a gate dielectric layer 200 may be formed on the exposed surface(s) of the bottom spacer(s) 190 and the sidewall(s) of one or more vertical fin(s) 131.

In various embodiments, the gate dielectric layer 200 may be a high-K dielectric material that may include, but is not limited to, metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xT_{1-x})O_3$), and lead zinc niobate (e.g., $PbZn_{1/3}Nb_{2/3}O_3$). The high-k material may further include dopants such as lanthanum and/or aluminum. The stoichiometry of the high-K compounds may vary.

In various embodiments, the gate dielectric layer 200 may have a thickness in the range of about 1.5 nm to about 2.5 nm.

Figure 14:
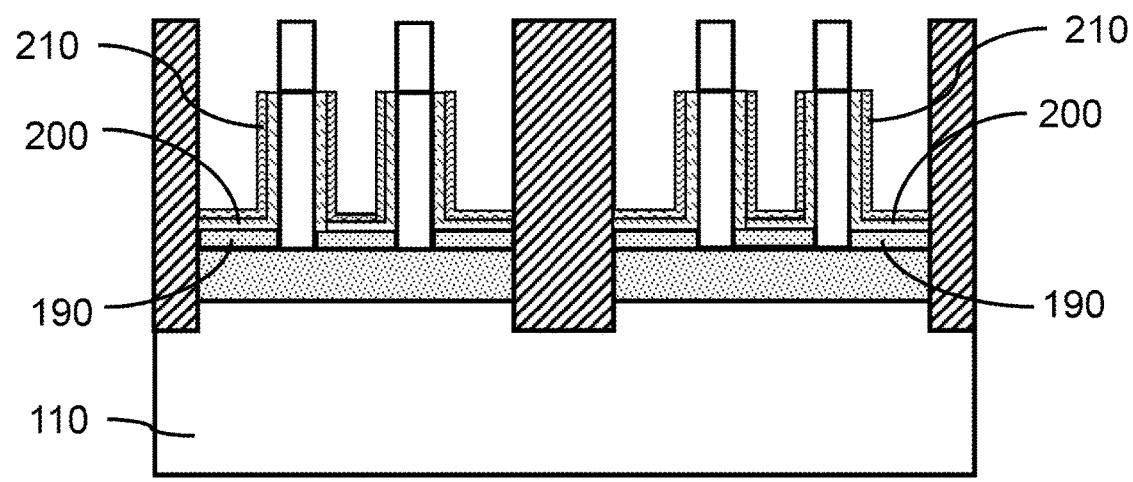
FIG. 14 is a cross-sectional view showing a work function layer on the gate dielectric layer to formed part of a gate structure, in accordance with the present principles.

FIG. 14 is a cross-sectional view showing a work function layer on the gate dielectric layer to formed part of a gate structure, in accordance with the present principles.

In various embodiments, a work function layer 210 may be formed on the vertical fin(s) 131. The work function layer 210 may be deposited on at least a portion of the bottom spacer 190 and/or gate dielectric layer 200 to form part of a gate structure on the vertical fins 131. The work function layer may be formed by atomic layer deposition (ALD), and/or chemical vapor deposition (CVD).

In various embodiments, the work function layer 210 may be a conductive nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof. The stoichiometry of the work function layer compounds may vary.

In various embodiments, the work function layer 210 may have a thickness in the range of about 3 nm to about 11 nm, or may have a thickness in the range of about 5 nm to about 8 nm.

Figure 15:
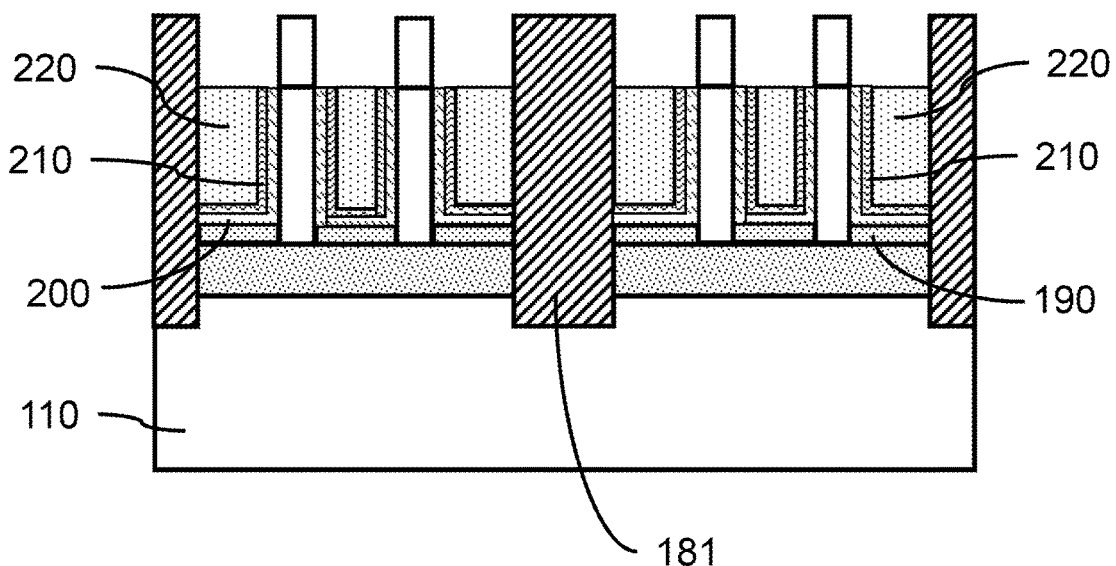
FIG. 15 is a cross-sectional view showing a gate metal fill on the work function layer to formed a gate structure, in accordance with the present principles.

FIG. 15 is a cross-sectional view showing a gate metal fill on the work function layer to formed a gate structure, in accordance with the present principles.

In one or more embodiments, a gate metal fill 220 may be formed on the work function layer 210, where the gate metal fill 220 may be a layer conformally deposited or blanket deposited on the work function layer 210. The gate metal fill may be formed by PVD. In various embodiments, the gate metal fill 220 may be tungsten (W), cobalt (Co), or a combination thereof. The gate structure may be recessed to define the gate length of the vertical FinFET. The gate metal fill 220 may form part of a gate structure, where the gate structure may be on a vertical fin 131.

Figure 16:
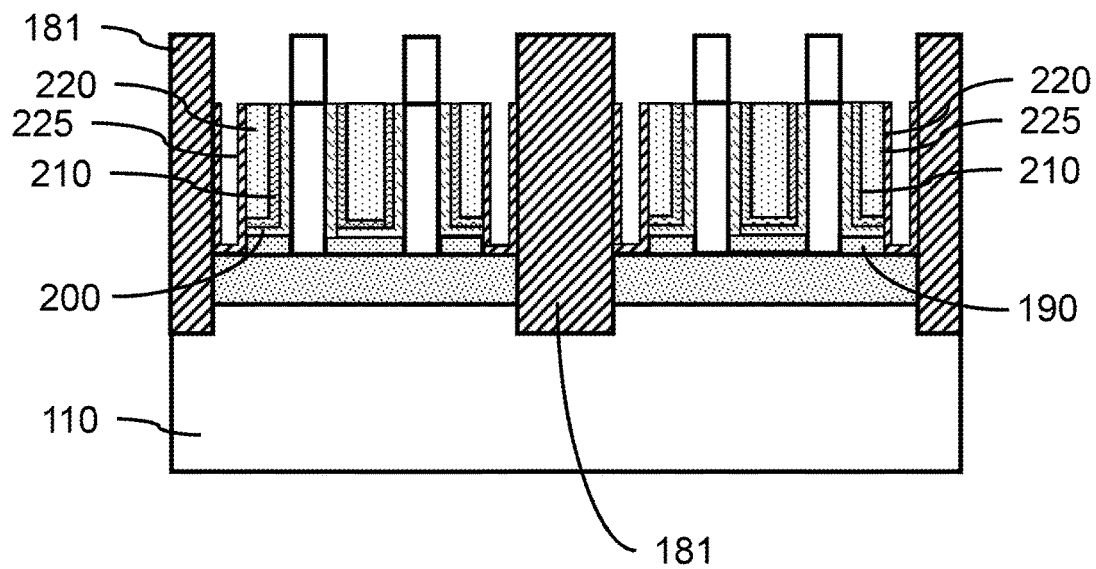
FIG. 16 is a cross-sectional view showing a portion of the gate metal fill and bottom spacer removed to form a contact gap, and a gap liner formed on the sidewalls of the contact gap, in accordance with the present principles.

FIG. 16 is a cross-sectional view showing a portion of the gate metal fill and bottom spacer removed to form a contact gap, and a gap liner formed on the sidewalls of the contact gap, in accordance with the present principles.

In one or more embodiments, a portion of the gate metal fill 220 may be masked. The top surfaces of the work function layer 210 and the gate dielectric layer 200 may also be covered by a mask. An exposed portion of the gate metal fill 220 may be removed to form a contact gap between the gate metal fill 220 and the dielectric spacer 181. A portion of the work function layer 210 exposed by the removal of the portion of the gate metal fill 220, a portion of the gate dielectric layer 200, and a portion of the bottom spacer 190 may also be removed to extend the contact gap at least to the top surface of the doped layer region 121. The contact gap may extend into the doped layer region 121. The width of the gate metal fill 220 may be reduced to form the gate structure on the vertical fin(s) 131.

In one or more embodiments, a gap liner 225 may be formed at least on the sidewalls of the contact gap. The gap liner 225 may be conformally deposited on the sidewalls of the dielectric spacer 181 and gate metal fill 220 to a predetermined thickness. The gap liner 225 may also be deposited on the exposed surface of the doped layer region 121. The gap liner may electrically isolate the gate metal fill 220 from a subsequently formed metal contact.

In various embodiments, the gap liner 225 may be a silicon nitride (SiN), where the gap liner 225 may be the same material as the dielectric spacer 181 and a different material than the doped layer region 121, such that the doped layer region 121 may act as an etch stop.

Figure 17:
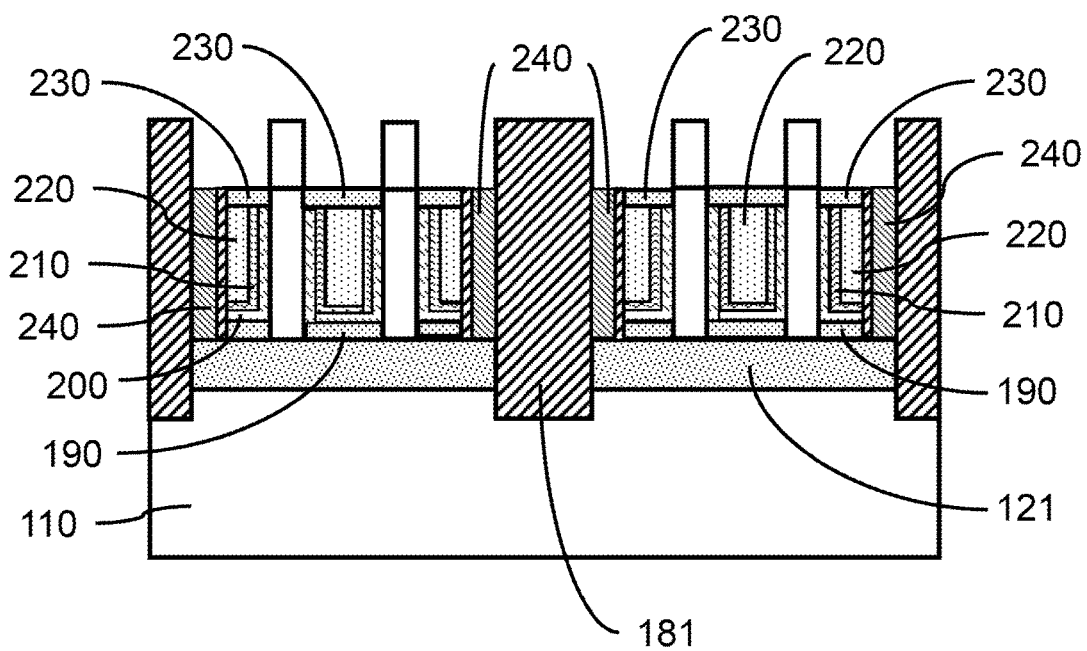
FIG. 17 is a cross-sectional view showing a portion of the gate metal fill replaced with a sacrificial spacer, and a top spacer on the gate structure, in accordance with the present principles.

FIG. 17 is a cross-sectional view showing a top spacer formed on top of the gate structure, and a portion of the gate metal fill replaced with a sacrificial spacer, in accordance with the present principles.

In one or more embodiments, at least a portion of the gap liner 225 on the top surface of the doped layer region 121 may be removed to expose the surface of the doped layer region 121. A sacrificial spacer 240 may be formed in the contact gap, where the sacrificial spacer 240 may be formed on a remaining portion of the gap liner 225, and on the surface of the doped layer region 121.

In various embodiments, the sacrificial spacer 240 may be silicon oxide (SiO) and/or carbon doped silicon oxide (SiCO).

In one or more embodiments, the height of the gate metal fill 220, gate dielectric layer 200, and work function layer 210, may be reduced to create a recess between the top surface of a vertical fin 131 and components of the gate structure. The height of the gate metal fill 220, gate dielectric layer 200, and work function layer 210, may be reduced by RIE. In various embodiments, a top spacer 230 may be formed in the recess between the top surfaces of the gate metal fill 220, gate dielectric layer 200, and work function layer 210, where the top spacer electrically isolates the gate structure from the channel formed by the vertical fin 131 and a top source/drain formed on one or more vertical fin(s) 131.

In various embodiments, the top spacer 230 may be a silicon nitride (SiN), where the top spacer 230 may be formed a similar process used to form the bottom spacer 190.

Figure 18:
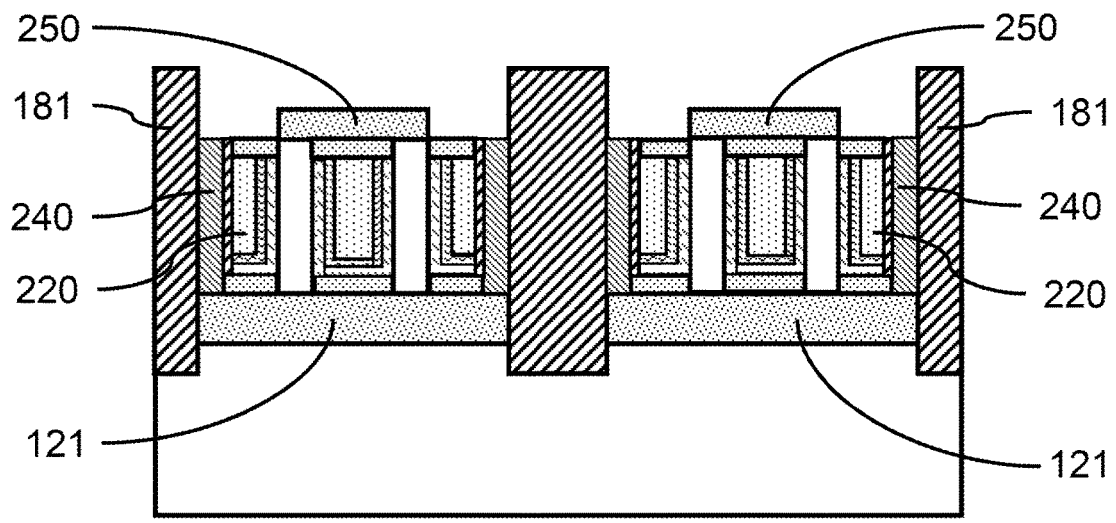
FIG. 18 is a cross-sectional view showing a top source/drain formed on a plurality of vertical fins, in accordance with the present principles.

FIG. 18 is a cross-sectional view showing a top source/drain formed on a plurality of vertical fins, in accordance with the present principles.

In one or more embodiments, the hardmask fin template(s) 141 may be removed from one or more vertical fin(s) 131, where removal of the one or more hardmask fin template(s) 141 may expose the top surface of one or more vertical fin(s) 131. The hardmask fin template(s) 141 may be removed, for example, by a selective wet etch that leaves the top surfaces of the top spacer(s) 230 and vertical fin(s) 131 exposed.

In various embodiments, a top source/drain 250 may be formed on one or more of the vertical fin(s) 131, where the top source/drain 250 may be epitaxially grown on the top surface of the one or more of the vertical fin(s) 131. The top source/drain 250 may be doped in-situ to form an n-type or a p-type finFET in conjunction with the doping of the doped layer regions 121 forming a bottom source/drain, substrate 110 (e.g., counter-doped well), and/or vertical fin 131.

In various embodiments, the top source/drain 250 may be Si, SiGe, and/or carbon doped Si (Si:C), where the top source/drain 250 and doped layer regions 121 may be doped with boron and/or gallium to form a p-type FET, and phosphorus, arsenic, and/or indium, to form an n-type FET.

Figure 19:
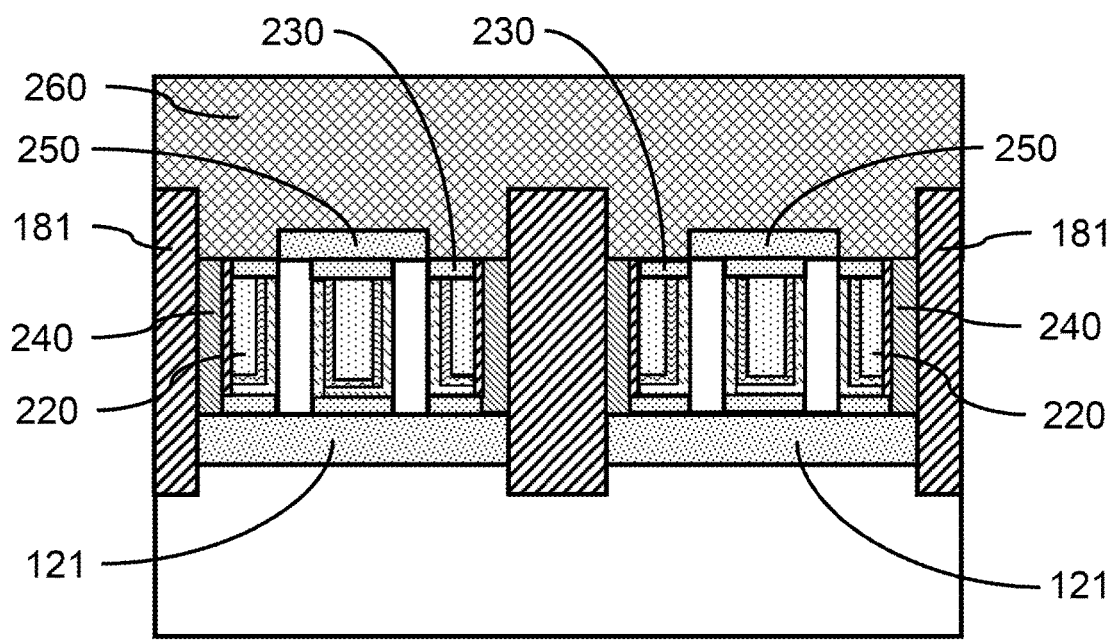
FIG. 19 is a cross-sectional view showing a dielectric cover layer on the top source/drain, top spacer, and sacrificial spacer, in accordance with the present principles.

FIG. 19 is a cross-sectional view showing a dielectric cover layer on the top source/drain, top spacer, and sacrificial spacer, in accordance with the present principles.

In one or more embodiments, a dielectric cover layer 260 may be formed on the top source/drain 250, top spacer 230, and sacrificial spacer 240, where the dielectric cover layer 260 may be an interlayer dielectric (ILD) separating metal contacts and metal-filled vias. In various embodiments, the dielectric cover layer 260 may be a silicon oxide. In a non-limiting example, the dielectric cover layer 260 may be a silicon oxide (SiO) layer deposited on silicon oxide (SiO) sacrificial spacer(s) 240 and silicon nitride dielectric spacer(s) 181, such that the silicon oxide dielectric cover layer 260 and silicon oxide sacrificial spacer(s) 240 may be selectively etched to form one or more contact vias 270.

Figure 20:
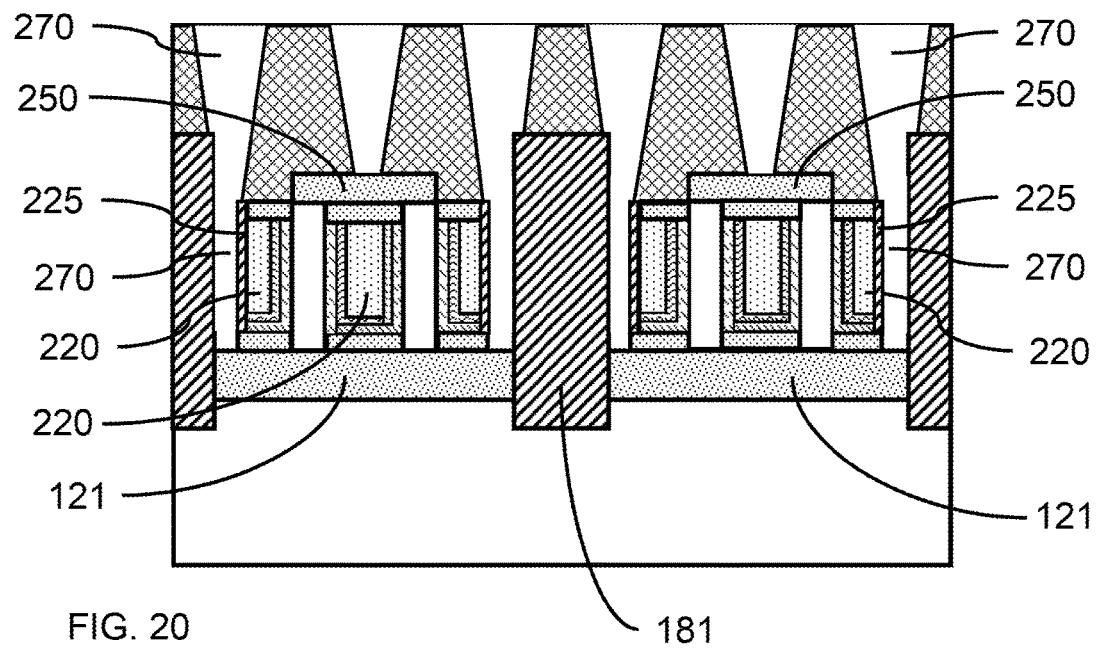
FIG. 20 is a cross-sectional view showing a plurality of contact vias formed in the dielectric cover layer and removal of the sacrificial spacers, in accordance with the present principles.

FIG. 20 is a cross-sectional view showing a plurality of contact vias formed in the dielectric cover layer and removal of the sacrificial spacers, in accordance with the present principles.

In one or more embodiments, a mask may be formed, patterned, and developed on the top surface of the dielectric cover layer 260 to expose portions of the dielectric cover layer 260 for subsequent etching. One or more contact vias 270 may be formed in the dielectric cover layer 260 by removing exposed portions of the dielectric cover layer. The contact vias 270 may extend through the dielectric cover layer 260 to the top source/drain(s) 250, doped layer region(s) 121, and/or gate metal fill 220 to form electrical contacts for back end of line (BEOL) connections.

In various embodiments, the contact vias 270 may extend to one or more sacrificial spacer(s) 240, and one or more sacrificial spacer(s) 240 may be selectively removed to form electrical contacts to the doped layer regions 121 forming a bottom source/drain.

Figure 21:
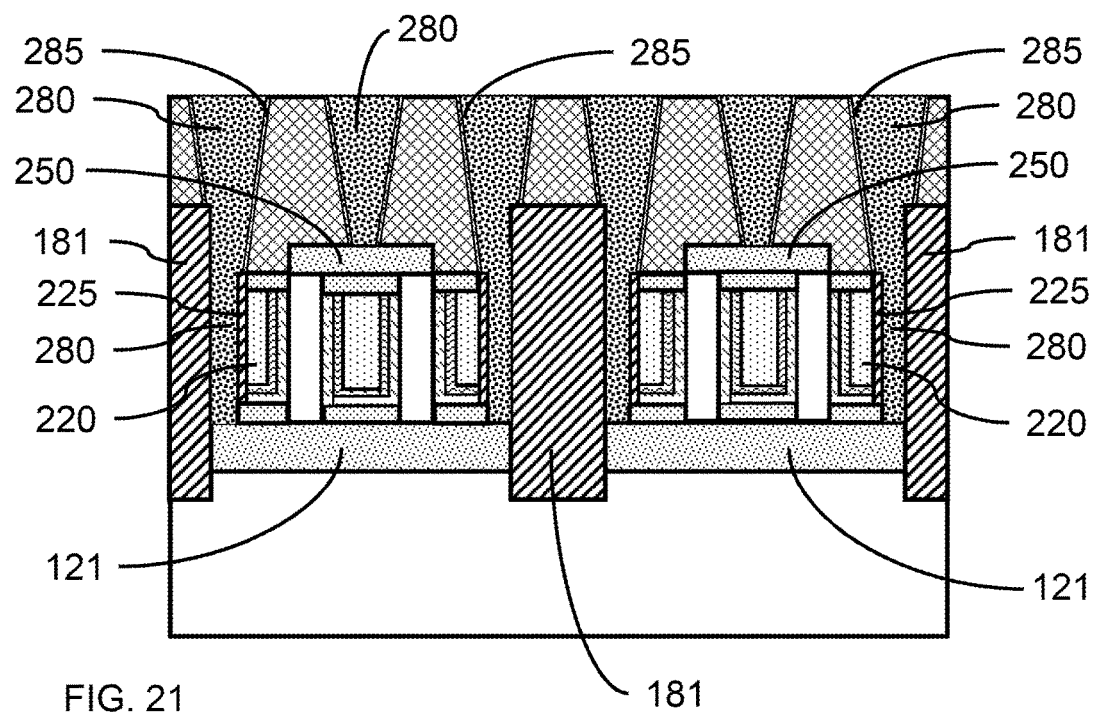
FIG. 21 is a cross-sectional view showing metal contacts formed in the plurality of contact vias, in accordance with the present principles.

FIG. 21 is a cross-sectional view showing metal contacts formed in the plurality of contact vias, in accordance with the present principles.

In one or more embodiments, a metal contact 280 may be formed in one or more of the contact vias 270, where the metal contacts 280 may be a metal fill deposited in the contact vias 270. The metal contacts 280 may form electrical connections to the doped layer regions 121, the top source/drain 250, and/or the gate metal fill 220.

In various embodiments, the metal contacts 280 may be tungsten (W), copper (Cu), molybdenum (Mo), cobalt (Co), nickle (Ni), titinium (Ti), or a combination thereof.

In various embodiments, a conductive liner 285, such as TiN, TaN, may be formed on the sidewalls of the contact vias 270 prior to formation of the metal contacts 280. The conductive liner 285 may suppress electro-migration and/or diffusion of the metal contact material.

In various embodiments, the dielectric cover layer 260 may act as an interlayer dielectric (ILD) to electrically isolate the metal contacts 280 formed in each of the contact vias 270. The ILD in conjunction with the dielectric spacer 181 may physically and electrically separate neighboring vertical finFETs.

In various embodiments, the gap liner 225 may physically and electrically separate a metal contact 280 formed in a contact via 270 from a gate metal fill 220, where the gap liner 225 may prevent an electrical short between an electrical contact to a bottom source/drain and an adjacent gate structure.

In various embodiments, two or more contact vias 270 and metal contacts 280 may be formed to doped layer regions 121 to increase the contact area between the electrical contact to a bottom source/drain, and thereby reduce the resistance between the metal contacts 280 and the bottom source/drain of a finFET device.

Figure 22:
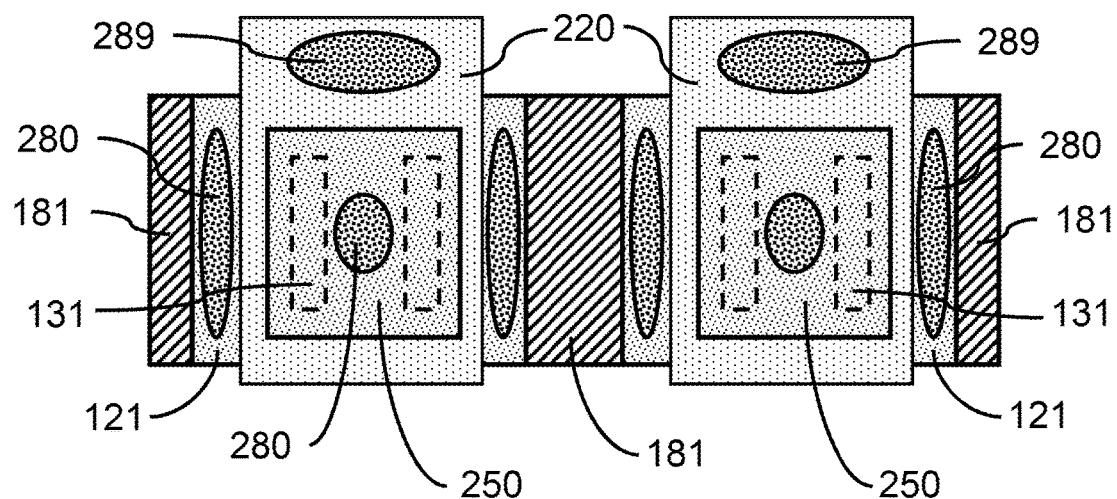
FIG. 22 is a top view of two multi-fin FETs with an intervening dielectric spacer, as shown in FIG. 21, in accordance with the present principles.

FIG. 22 is a top view of two multi-fin FETs with an intervening dielectric spacer, as shown in FIG. 21, in accordance with the present principles.

In one or more embodiments, a gate contact 289 may be formed by a metal contact 280 to a gate metal fill 220 (where the gate contact 289 is behind the plane shown in FIG. 21). The top source/drains 250 may be above the plurality of the vertical fins 131 (shown as dashed lines), and the doped layer regions 121 may form bottom source/drains below the plurality of the vertical fins 131. The metal contacts 280 may be in electrical connection with the top source/drains 250 and doped layer regions 121 through the contact via 270. The dielectric spacer 181 may separate and electrically isolate the metal contacts 280, and the doped layer regions 121, of the finFETs.

Figure 23:
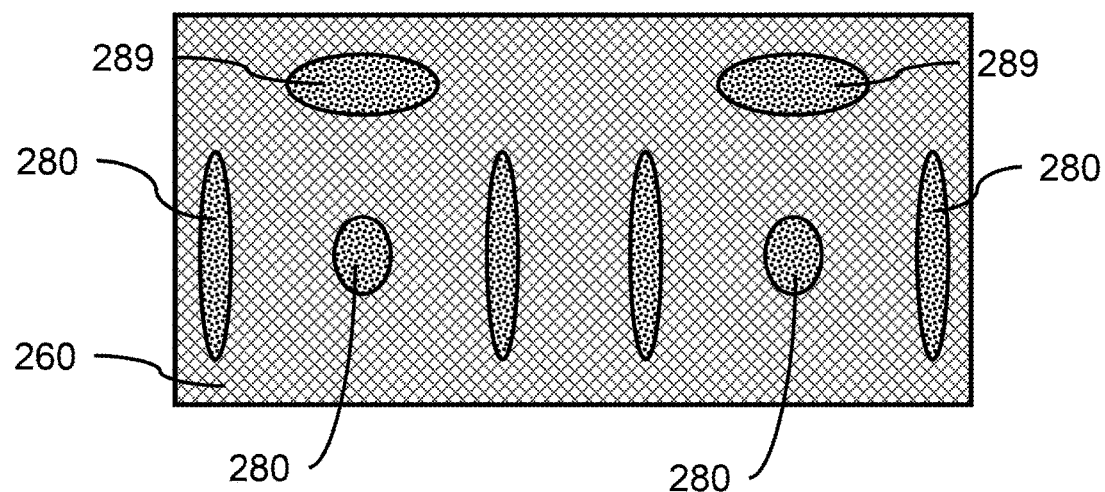
FIG. 23 is a top view of the metal contacts and gate contacts separated by an ILD, in accordance with the present principles.

FIG. 23 is a top view of the metal contacts and gate contacts separated by an ILD, in accordance with the present principles.

In various embodiments, the dielectric cover layer 260 in conjunction with the dielectric spacer 181 may physically and electrically separate the contact vias 270 and metal contacts 280, including the gate contact 289.

It is to be understood that the present invention is described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

While exemplary embodiments have been shown for a particular device, it should be understood that a plurality of such devices may be arranged and/or fabricated on a substrate to form integrated devices that may be integrated onto a substrate, for example through very large scale integration to produce complex devices such a central processing units (CPUs) and application specific integrated circuits (ASICs). The present embodiments may be part of a device or circuit, and the circuits as described herein may be part of a design for an integrated circuit chip.

Having described preferred embodiments of a method and device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical fin field effect transistor (vertical finFET) with a self-aligned bottom source/drain, comprising:
    forming a doped layer on a substrate;
    forming one or more vertical fins on the doped layer;
    forming a protective layer on the one or more vertical fins, wherein the protective layer has a thickness; and
    forming at least one isolation trench through the doped layer by removing at least a portion of the protective layer on the doped layer, wherein the isolation trench is laterally offset from a sidewall of at least one of the one or more vertical fins by the thickness of the protective layer.

2. The method of claim 1, wherein the lateral offset defines a periphery of a doped region formed from the doped layer for a bottom source/drain.

3. The method of claim 1, wherein the protective layer is formed on the one or more vertical fins by atomic layer deposition (ALD), chemical vapor deposition (CVD) or a combination thereof.

4. The method of claim 1, wherein the protective layer has a thickness in the range of about 5 nm to about 50 nm.

5. The method of claim 1, wherein the one or more isolation trench(es) extends through the doped layer to form two or more doped layer regions, wherein at least one vertical fin is on a first region and at least one vertical fin is on a second region.

6. The method of claim 5, further comprising forming a gate structure on at least one of the one or more vertical fins, and forming a contact gap through the gate structure to one of the two or more doped layer regions.

7. The method of claim 1, further comprising filling the at least one isolation trench with a dielectric spacer, wherein the dielectric spacer physically separates two or more vertical fins into at least two vertical fin field effect transistors (vertical finFETs).

8. The method of claim 7, wherein the dielectric spacer is silicon nitride.

9. The method of claim 1, further comprising forming a top source/drain on at least one of the one or more vertical fins.

10. A method of forming a vertical tin field effect transistor (vertical finFET) with a self-aligned bottom source/drain, comprising:
    forming a doped layer on a substrate;
    forming a plurality of vertical fins on the doped layer, wherein there is a distance between at least two adjacent vertical fins forming an intervening space;
    forming a protective layer on the plurality of vertical fins on, wherein the protective layer has a thickness equal to or greater than half the distance between the at least two adjacent vertical fins, such that the protective layer fills the intervening space; and
    forming at least one isolation trench through the doped layer by removing at least a portion of the protective layer on the doped layer, wherein the protective layer filling the intervening space prevents formation of the at least one isolation trench in the intervening space.

11. The method of claim 10, wherein the distance between the at least two adjacent vertical fins is in the range of about 10 nm to about 100 nm.

12. The method of claim 10, wherein the protective layer has a thickness in the range of about 5 nm to about 50 nm, and the thickness of the protective layer defines a lateral offset of the isolation trench from the plurality of vertical fins.

13. A vertical fin field effect transistor (vertical finFET) having a self-aligned bottom source/drain, comprising;
    one or more doped layer regions on a substrate;
    one or more vertical fins formed on one of the one or more doped layer regions, wherein the one of the one or more doped layer regions forms a bottom source/drain for the one or more vertical fins;
    one or more dielectric spacer(s) on the substrate, wherein at least one of the one or more dielectric spacers) is offset from at least one of the one or more vertical fins by a width, $W_1$, that defines a boundary along a side of one of the one or more doped layer regions; and
    a metal contact between the at least one of the one or more dielectric spacer(s) and the at least one of the one or more vertical fins, wherein the metal contact is on the one of the one or more doped layer regions and in electrical contact with the one of the one or more doped layer regions.

14. The vertical finFET of claim 13, wherein the width, $W_1$, is in the range of about 5 nm to about 50 nm.

15. The vertical finFET of claim 13, wherein the one or more doped layer regions is silicon germanium (SiGe) doped with boron to form a p-type FET.

16. The vertical finFET of claim 13, further comprising a top source/drain on the one or more vertical fins formed on the one of the one or more doped layer regions, wherein the top source/drain is silicon germanium (SiGe) doped with boron to form a p-type FET.

17. The vertical finFET of claim 13, wherein the one or more dielectric spacer(s) is silicon nitride (SiN).

18. The vertical finFET of claim 13, wherein the metal contact is tungsten (W), copper (Cu), molybdenum (Mo), cobalt (Co), or a combination thereof.

19. The vertical finFET of claim 13, further comprising a gate structure on the one or more vertical tins formed on the one of the one or more doped layer regions.

20. The vertical finFET of claim 19, further comprising a gap line wherein the gap liner is between the gate structure and the at least one of the one or more dielectric spacer(s) offset from the at least one of the one or more vertical fins, and the gap liner physically and electrically separates the metal contact from the gate structure.

* * * * *